United States Patent
Hoden

(10) Patent No.: US 6,352,873 B1
(45) Date of Patent: Mar. 5, 2002

(54) METHOD FOR MODULAR LASER DIODE ASSEMBLY

(75) Inventor: Brian P. Hoden, Edgewood, NM (US)

(73) Assignee: Decade Products, Inc., Albuquerque, NM (US)

( * ) Notice: Subject to any disclaimer, the term of this patent is extended or adjusted under 35 U.S.C. 154(b) by 0 days.

(21) Appl. No.: 09/556,767

(22) Filed: Apr. 24, 2000

Related U.S. Application Data

(63) Continuation-in-part of application No. 09/170,491, filed on Oct. 13, 1998, now Pat. No. 6,295,307.
(60) Provisional application No. 60/062,106, filed on Oct. 14, 1997.

(51) Int. Cl.[7] .............................................. H01L 21/00
(52) U.S. Cl. ............................... 438/28; 438/25; 438/31
(58) Field of Search ............................... 438/25, 32, 34, 438/35, 31, 28, 39, 46, 29, 60, 77; 372/34, 36

(56) References Cited

U.S. PATENT DOCUMENTS

| | | | |
|---|---|---|---|
| 4,092,614 A | | 5/1978 | Sakuma et al. |
| 4,803,691 A | * | 2/1989 | Scifres et al. ............... 372/150 |
| 4,881,237 A | | 11/1989 | Donnelly |
| 4,903,274 A | | 2/1990 | Taneya et al. |
| 4,947,401 A | | 8/1990 | Hinata et al. |
| 4,980,893 A | | 12/1990 | Thornton et al. |
| 5,031,187 A | | 7/1991 | Orenstein |
| 5,040,187 A | | 8/1991 | Karpinski |
| 5,060,237 A | | 10/1991 | Peterson |
| 5,061,974 A | | 10/1991 | Onodera et al. |
| 5,099,488 A | | 3/1992 | Ahrabi et al. |
| 5,105,430 A | | 4/1992 | Mundinger |
| 5,128,951 A | | 7/1992 | Karpinski |
| 5,212,707 A | | 5/1993 | Heidel et al. |
| 5,253,260 A | * | 10/1993 | Palombo ..................... 372/34 |
| 5,284,790 A | | 2/1994 | Karpinski |
| 5,305,344 A | | 4/1994 | Patel |
| 5,311,530 A | * | 5/1994 | Wagner et al. ................ 372/36 |
| 5,311,535 A | | 5/1994 | Karpinski |
| 5,325,384 A | | 6/1994 | Herb et al. |
| 5,394,426 A | * | 2/1995 | Joslin ........................... 372/50 |
| 5,418,799 A | | 5/1995 | Tada |
| 5,440,577 A | | 8/1995 | Tucker |
| 5,497,391 A | | 3/1996 | Paoli |
| 5,526,373 A | | 6/1996 | Karpinski |
| 5,568,498 A | | 10/1996 | Nilsson |
| 5,593,815 A | * | 1/1997 | Ahn ........................... 430/321 |
| 5,627,850 A | | 5/1997 | Irwin |

(List continued on next page.)

*Primary Examiner*—Charles Bowers
*Assistant Examiner*—Brook Kebede
(74) *Attorney, Agent, or Firm*—Rod D. Baker

(57) ABSTRACT

A method for laser diode bar assembly. A method for assembling a modular stacked diode array is disclosed, whereby a diode bar is bonded between a pair of conductive spacers, as by soldering, to create a diode submodule. Each submodule, prior to being affixed to a substrate, may be individually pre-tested. Any number of diode bar submodules then may be affixed to a substrate to construct a diode bar array. A stacked array embodiment assembled according to the method provides for efficient cooling of the diode bars and electrical connection between diode bars while maximizing alignment of the diode bars. The spacers are connected to a conductive surface on a heat spreader. In the stacked array, one or more diode bars are alternated in series with two or more conductive spacers, with a series circuit provided from diode bar to diode bar. The spacers hold the diodes spaced apart from insulating grooves in the conductive layer on the substrate. Alternatively, thermally conductive separator fins extend from the heat spreader substrate to contact the diode bars situated between the spacers to promote rapid heat transfer from the diodes while maintaining the diode bars electrically isolated from tie conductive layer on the substrate.

11 Claims, 9 Drawing Sheets

U.S. PATENT DOCUMENTS

| | | |
|---|---|---|
| 5,644,586 A | 7/1997 | Kawano et al. |
| 5,835,515 A * | 11/1998 | Huang .......................... 372/36 |
| 5,835,518 A * | 11/1998 | Mundinger et al. ........... 372/50 |
| 5,848,083 A * | 12/1998 | Haden et al. ................. 372/36 |
| 5,909,458 A | 6/1999 | Freitas et al. |
| 5,930,279 A | 7/1999 | Apollonov et al. |
| 6,208,677 B1 * | 3/2001 | Moyer .......................... 372/66 |

* cited by examiner

METHOD FOR MODULAR LASER DIODE ASSEMBLY

CROSS-REFERENCE TO RELATED APPLICATIONS

This application is a continuation-in-part of application Ser. No. 09/170,491, filed Oct. 13, 1998 now U.S. Pat. No. 6,295,307, entitled "Laser Diode Assembly," which claims the benefit of the filing of U.S. Provisional Patent Application Ser. No. 60/062,106, entitled "Laser Diode Assembly" filed on Oct. 14, 1997. The specifications of both these prior applications are incorporated herein by reference.

BACKGROUND OF THE INVENTION

1. Field of the Invention (Technical Field)

The present invention relates to laser diodes, particularly to a laser diode assembly which promotes accurate spacing and alignment of diode bars, cooling of diode bars and electrical conductivity through the diode bars, as well as modularized assembly and pre-testing.

2. Background Art

Laser diode arrays are in general use in a wide variety of industrial and research applications. Pluralities of diode bars are mounted up on a substrate to provide the multiplied power of numerous bars, versus the effect offered by a single bar. To optimize the efficiency of a multiple diode bar array, it is desirable not only that the diode bars be properly aligned so that their emitter surfaces face the same direction, but electrical conductivity between bars and cooling of the bars should be optimized.

Most efforts in the art have focused upon modes and means of mounting numerous diode bars quickly and inexpensively. The mounting of numerous bars into a single array historically has been a somewhat labor and/or cost intensive proposition, thus partially impeding the development of economical products and devices incorporating laser diode arrays.

U.S. Pat. Nos. 5,040,187 and 5,284,790, both to Karpinski, show a "monolithic" laser diode array. The disclosure teaches a substrate having a number of grooves therein, and into which the diode bars are inserted. The substrate ostensibly is flexed into an arc to widen the grooves; the diode bars are inserted into the temporarily widened grooves, after which the substrate is relaxed and allowed elastically to return to its normal shape, which results in an effective narrowing of the grooves thereby to help hold the inserted diodes in place. A variety of "submounts" for the array also are taught. However, the methods and configurations of the disclosures are not conducive to diode bar alignment, as the bars tend to tip and roll within the grooves during assembly.

U.S. Pat. No. 5,128,951 to Karpinski also shows a particular type of laser diode array and method of fabrication. The disclosure has to do with providing an inexpensive mode of manufacturing a diode bar array. A substrate is provided with two layers, an upper conductive layer immediately above and in flush contact with a lower non-conductive layer. The grooves for receiving the diode bars are cut into the substrate so as to completely pierce the upper layer and penetrate into the lower non-conductive layer. The disclosure purports thereby to provide a means for mounting diode bars which promotes conductivity between bars while also providing heat transfer into the lower electrically insulating layer. The diode bars do not have optimal contact with the "heat sink" lower layer, and maximized alignment of the bars in the grooves also is not taught.

U.S. Pat. No. 5,305,344 to Patel discloses a laser diode array. The disclosure teaches diversity in diode bar packing, and a configuration which possibly eases the replacement of defective individual bars, but is comparatively complex and expensive.

U.S. Pat. No. 5,311,535 to Karpinski shows a laser diode array which provides for laser emission from the minor surfaces of the diode bars. The device involves the disposition of diode bars into a grooved substrate. Diode bar alignment is not carefully optimized.

Other United States patents of interest in the field include U.S. Pat. No. 5,644,586 to Kawano et al.; U.S. Pat. No. 5,627,850 to Irwin et al.; U.S. Pat. No. 5,568,498 to Nilsson; U.S. Pat. No. 5,497,391 to Paoli; U.S. Pat. No. 5,418,799 to Tada; U.S. Pat. No. 5,440,577 to Tucker; U.S. Pat. No. 5,394,426 to Joslin; U.S. Pat. No. 5,212,707 to Heidel et al.; U.S. Pat. No. 5,105,430 to Mundinger et al.; U.S. Pat. No. 5,031,187 to Orenstein et al.; U.S. Pat. No. 5,061,974 to Onodera et al; U.S. Pat. No. 5,060,237 to Peterson; U.S. Pat. No. 4,980,893 to Thornton et al.; U.S. Pat. No. 4,947,401 to Hinata et al.; U.S. Pat. No. 4,903,274 to Taneya et al.; U.S. Pat. No. 4,881,237 to Donnelly; and U.S. Pat. No. 4,092,614 to Sakuma et al. Nevertheless, a need remains for a means and method of providing a laser diode array which at once is simple and economical, and yet optimizes proper diode bar alignment to promote emission efficiency without sacrificing efficient electrical conductivity between, and cooling of, the diode bars. Further, there is a need, addressed by the present invention, for a modular method of laser diode assembly that permits submodules of an assembly to be individually tested and/or replaced. Against this background, the present invention was developed.

SUMMARY OF THE INVENTION (DISCLOSURE OF THE INVENTION)

The invention includes a wedged array embodiment of a diode bar assembly, a stacked array embodiment, and methods and apparatus for assembling the stacked and wedged arrays.

More specifically, the invention includes a method for assembling a diode bar assembly. An aspect of the method is the construction of a plurality of diode submodules, each submodule assembled by the steps of: (a) locating a first conductive spacer upon a planar working surface; (b) disposing a first solder preform, having a melting temperature, upon the first conductive spacer; (c) placing a diode bar upon the first solder preform; (d) disposing a second solder preform having a melting temperature upon the diode bar; (e) placing a second conductive spacer upon the second solder preform; (f) compressing the spacers, preforms and diode bar parallel together; (g) heating the solder preforms above their melting temperatures; and (h) allowing the melted solder preforms to harden by cooling, thereby bonding the spacers to the diode bar, and wherein the spacers bonded to the diode bar define a diode submodule. The step of compressing may comprise disposing a weight upon the second spacer. The step of heating preferably comprises placing the submodule in a controlled heat source while compressing the spacers, solder preforms, and diode bar.

The inventive method further comprises the assembly of a plurality of submodules into a diode bar array, comprising the step of affixing a plurality of diode submodules, prepared according to steps (a)–(h) above, upon a substrate, the substrate being provided with a plurality of conductive strips, wherein after affixing the conductive strips are in electrical contact with respective solder preforms; and wherein the plurality of submodules affixed to the substrate define a diode bar array. The plurality of conductive strips preferably comprise solder having a melting temperature less than the melting temperatures of the solder preforms, wherein the step of affixing comprises the steps of: (a) heating the plurality of submodules, the conductive strips, and the substrate to a temperature between the melting temperature of the conductive strips and the lowest melting temperature of the solder preforms; and (b) allowing the melted conductive strips to harden by cooling, thereby bonding the submodules to the substrate. Alternatively, where the plurality of conductive strips comprise solder pre-applied to the substrate, the step of affixing may comprise the step of applying epoxy glue between the submodules and the substrate.

Thus there is disclosed a method for assembling a diode bar array, which comprises overall steps of: (a) locating a first conductive spacer upon a planar working surface; (b) disposing a first solder preform, having a melting temperature, upon the first conductive spacer; (c) placing a diode bar upon the first solder preform; (d) disposing a second solder preform having a melting temperature upon the diode bar; (e) placing a second conductive spacer upon the second solder preform; (f) compressing the spacers, preforms and diode bar parallel together; (g) heating the solder preforms above their melting temperatures; (h) allowing the melted solder preforms to harden by cooling, thereby bonding the spacers to the diode bar, and wherein the spacers bonded to the diode bar define a diode submodule; and (i) affixing a plurality of diode submodules prepared according to steps (a)–(h) upon a substrate, the substrate being provided with a plurality of conductive strips, wherein after affixing the conductive strips are in electrical contact with respective solder preforms; and wherein the plurality of submodules affixed to the substrate define a diode bar array.

A primary object of the present invention is to provide a laser diode assembly that is economically and simply assembled.

A primary advantage of the present invention is that the laser diode bars in the inventive assembly are optimally aligned to minimize diode emission wave front distortions.

Another advantage of the invention is the provision of a method for assembling diode bar arrays that permits individual diode submodules to be individually pre-tested, and separately replaced, as needed.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings.

Figure 1:
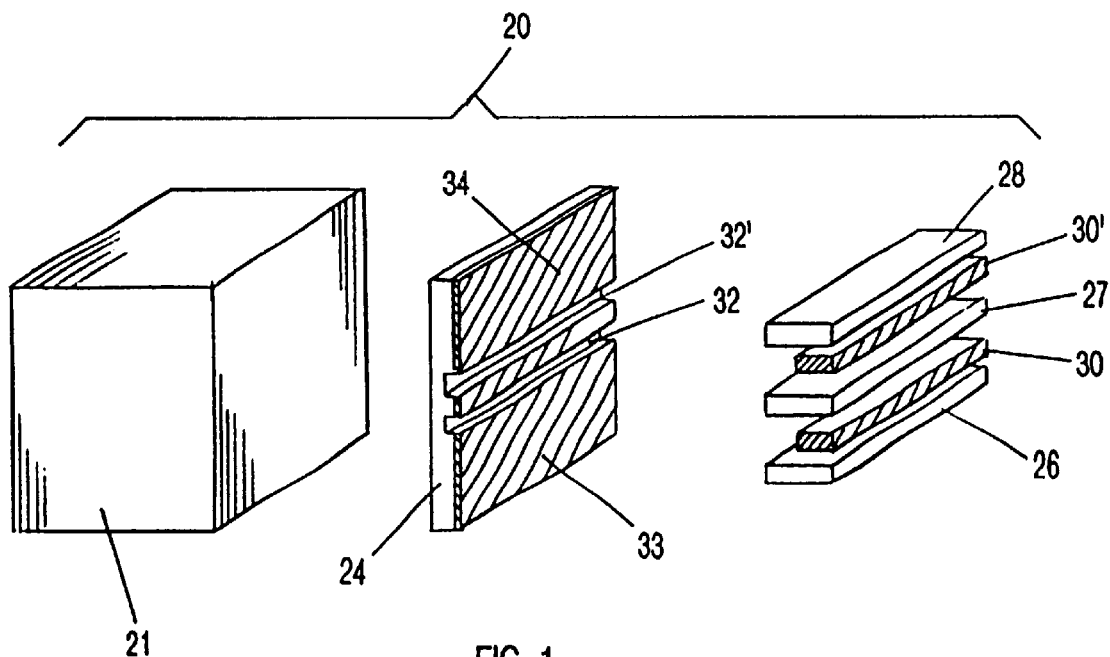
FIG. 1 is an exploded view of one version of the stacked array embodiment of the diode bar assembly according to the present invention.

DESCRIPTION OF THE PREFERRED EMBODIMENTS (BEST MODES FOR CARRYING OUT THE INVENTION)

The present invention relates to laser diode apparatus and methods of assembly. The apparatus of the invention is an assembly of laser diode bars. By the apparatus and method of the invention, a laser diode bar assembly is provided having diode bars that are optimally aligned and may be densely packed. Parallelism of the diode bars is enhanced and diode bar curvature is eliminated. The apparatus of the invention manifests increased efficiencies in cooling and electrical continuity, and finds ready application in any area in which high power semiconductor laser arrays are used or desired. In one embodiment of the method of the invention, the array is composed of a plurality of separately constructed sub-modules, which permits individual diode bars to be pre-tested for performance or characteristics before installation on a substrate to define an array, or for individual post-installation replacement as needed.

The apparatus of the invention features two principal embodiments, a "stacked array" embodiment and a "wedged array" embodiment. Either embodiment offers the advantages of superior diode bar alignment and cooling and conductivity efficiency and performance. The two embodiments have many features in common, but may be manufactured using somewhat differing processes as described herein. The user of the invention is free to select the apparatus embodiment that best suits the particular application.

The stacked array embodiment includes four main parts; a plurality of laser diode bars, thermally conductive and electrically conductive spacers, a thermally conductive and electrically non-conductive heat spreader base substrate, and a coolant manifold. The laser diode bars useable in the invention are available off-the-shelf. The diode bars are provided with a layer of gold or other conductive material to provide electrical continuity. The spacers are parts machined to specification, and typically are fashioned from a metallic alloy. The specification of the spacers depends upon the spacing required between diode bars; thus a particular diode bar assembly may have spacers machined to the specific needs of the given assembly. The spacers preferably are coated with solder. The heat spreader base substrate is provided with either grooves or fins in order to electrically isolate the diode bars from the substrate. As further explained below, the diodes are sandwiched between, and connected to, the spacers. The sandwiched configuration promotes diode bar alignment and parallelism, as well as enhancing electrical continuity between diode bars. The spacer-diode assemblies are then attached to the heat spreader substrate, and the substrate may then be attached to the coolant manifold.

Broadly characterized, the invention thus includes stacked and soldered layers of laser diode bars and conductive spacers to form an electrical path for the diode bars in a series arrangement. In alternative embodiments, the diode bars can be connected can be connected in parallel or a combination of series and parallel circuits. The spacers are coated with a thin layer of material such as solder to facilitate assembly.

The electrically non-conductive heat spreader base substrate features metalized grooves or fins to accept the stacked diode bars and spacers. In one version of the stacked array embodiment, a mounting face of the heat spreader substrate may be metalized or coated with a conductive material and grooves cut through the conductive layer. The spacers are soldered or otherwise conductively connected to the conductive layer, while the diodes are situated "above" spaced apart from the grooves. In another desirable version, the heat spreader substrate is provided with perpendicularly extending fins having metalized or otherwise conductive sides. The spacers are soldered or otherwise conductively joined to the fins, while the diodes remain electrically isolated from the substrate.

The practice of the invention includes the optional use of a jig assembly apparatus wherewith the diode bars and spacers are compressed together to form a parallel diode bar assembly. The coolant manifold, heat spreader, diode bars and spacers are soldered together for good thermal conduction. An advantage of the invention is that by selectively re-heating selected portions of the laser diode assembly, a individual diode bars can be removed and replaced as needed.

Attention is invited to FIG. 1, showing elements of a version of the "stacked array" embodiment of the invention.

The laser diode bar assembly 20 includes a coolant manifold 21, a heat spreader base substrate 24, one or more spacers 26, 27, 28 and at least one, preferably a plurality, of laser diode bars 30, 30'. The coolant manifold 21 is typical to the art in general function and construction. Manifold 21 is a thermally conductive block or element which serves to draw off thermal energy away from the diode bars 30, 30'. The manifold 21 may feature passages (not shown) therein through which coolant flows to promote cooling of the assembly, all according to generally known principles. The manifold 21 optionally may be provided with metal or other thermally conductive fins disposed therein to increase heat transfer. Alternatively, the coolant manifold 21 may be a thermal electric cooler, also constructed according to generally known principles. In either case, the manifold 21 may be a machined part or can be purchased off-the-shelf from existing vendors.

The spacers 26, 27, 28 preferably are fashioned from copper or other conductive material. Each spacer preferably also is coated, e.g., with a 0.001- to 0.002-inch thick solder, most preferably a 80/20 gold-tin solder coating. Alternatively, the spacers 26–28 may be plated, for example with gold, and thin solder pads carefully situated between the spacers and the diode bars 30, 30' during the construction of the diode bar assembly 20.

The heat spreader base substrate 24 is machined component composed of a rigid, thermally conductive, but electrically non-conductive material, beryllium oxide being a preferable example. Base substrate alternatively may comprise aluminum nitride. The heat spreader substrate 24 functions in the assembly 20 to remove heat from the diode bars 30, 30' without providing an electrical path which shorts out the diode bars 30, 30'. Of course, the substrate 24 ideally has a very high thermal conductivity so to rapidly move thermal energy into the manifold 21. The thickness of the heat spreader substrate 24 is minimized if, as in the depicted embodiment, it is to be soldered or otherwise joined to a heat sink such as the coolant manifold 21 or thermal electric cooler. The spreader substrate 24 is cut to the length of the diode bars 30, 30' and spacers, as suggested by FIG. 1, while the thickness of the base substrate 24 is dependent upon the number of diode bars 30, 30' desired to be mounted in the assembly 20. Spreader base substrate 24 is fashioned to specification such that at least one, and preferably two or more, grooves 32, 32' are defined in one mounting face 33 thereof, as seen in FIG. 1. Grooves 32, 32' are parallel, and correspond in number with the number of diode bars 30, 30' to be mounted. As best seen in FIG. 1, the mounting face 33 of the base substrate 24 is plated or otherwise coated with a conductive layer 34, e.g., of metal. The grooves 32, 32' are machined or otherwise formed to fully penetrate the conductive layer 34, such that the walls and bottoms of the grooves are thermally, but not electrically, conductive. When the diode bar assembly 20 is properly assembled, the diode bars 30, 30' are disposed parallel and to the grooves 32, 32', but are not inserted therein.

One mode of manufacturing the heat spreader base substrate may be, for example, to provide a nonconductive base 24 of aluminum nitride on which an upper plate of conductive material 34 is bonded using high temperature epoxy. Such basic sub-assemblies of non-conductive bases with an attached plate of conductive material are commercially available. Once so bonded, the diode bar grooves 32, 32' are cut into the conductive plate 34 by either an EDM wire or mechanical cut. The grooves 32, 32' are cut completely through the conductive plate 34. The diode bars 30, 30' may then be inserted into the grooves 30, 30'.

Also as seen in FIG. 1, the spacers 26–28 have a width dimension greater than the width dimension of the diode bars 30, 30'. The edges on one side of the spacers and diode bars are aligned to be flush, so that on the opposite side of the subassembly, the spacers 26, 27, 28 project or extend equidistantly laterally beyond the diode bars 30, 30', toward the substrate 24, as illustrated. The spacers have a thickness corresponding generally to the distance between the grooves 32, 32', so that the diode bars 30, 30' are suspended apart from, but parallel, to the grooves when the apparatus is fully assembled, as seen in FIG. 2.

Continued reference to FIG. 1 shows that the diode bars 30, 30' and spacers 26, 27, 28 are placed in alternating contact, with each diode bar 30 located between and in contact with two spacers 26, 27. Thus, the diode bars 30, 30' and spacers 26, 27, 28 are arranged in a contiguous stacked array of spacers alternated with diode bars. When "sandwiched" in such stacks, in mutual contact, the sub-module or subassembly of diode bars 30, 30' and spacers 26, 27, 28 may be pressed together and secured by the expedient of heating the subassembly to melt the solder (or equivalent conductive adhesive) on the spacer bars to bind the spacers to the metalized coating on the diode bars. Upon the hardening of the solder cement, the spacer-diode bars subassembly can be manipulated as a unit for attachment to the heat spreader substrate 24. A mode and apparatus for assembling the diode-spacer bar subassembly is described hereinafter.

The spacers 26–28 and diode bars 30, 30' having been secured together in the alternating array, the spacer-diode bar sub-assembly is fastened to the heat spreader base substrate 24. After the diode bars 30, 30' are aligned parallel to the grooves 32, 32', the extended edges of the spacers 26, 27, 28 are contacted with and soldered to the conductive layer 34 on the face 33. The back side 35 of the base substrate, which preferably also is plated or coated with a conductive metal, is then soldered or otherwise conductively adhered to the manifold 21.

Figure 2:
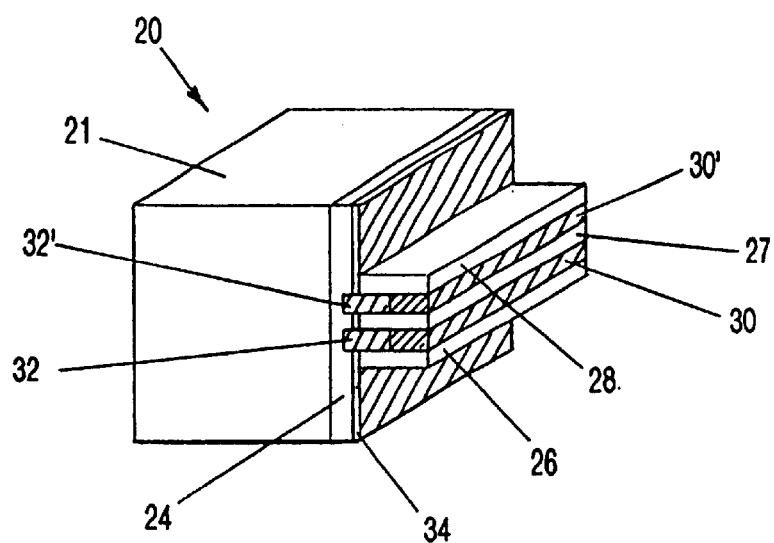
FIG. 2 is a perspective view of the assembly shown in FIG. 1, illustrating the completed assembly.

FIG. 2 depicts the stacked array embodiment of the diode bar assembly in the fully assembled configuration. The electrically and thermally conductive spacers 26, 27, 28 hold the diode bars in spaced-apart parallel relation to each other, and also serve to provide the electrical and physical connection between the diode bars and the conductive layer 34 on the heat spreader base substrate 24. The base substrate 24 in turn provides the thermal and physical connection between the spacers 26, 27, 28 and the coolant manifold 21. Notably, because the spacers and diode bars were secured together under compression, the diode bars are maintained in optimized parallel alignment. The spacers 26, 27, 28 also hold the diode bars 30, 30' a spaced distance apart from the base substrate 24, thereby thermally isolating the diode bars to keep them comparatively cool. Nevertheless, the diode bars 30, 30' are in direct electrical series, as current is free to flow, e.g. into the bottom of the conductive layer 34, through the first spacer bar 26 and into the first diode bar 30, thence into the second spacer bar 27 and thence into the second diode bar 30', into the third spacer 28, and on out the top of the conductive layer 34. As the base substrate 24 is a comparative insulator, the circuit is electrically efficient while heat nevertheless is quickly transferred from the spacers 26, 27, 28 through the substrate 24 and into the manifold 21. The circuit thus functions while maintaining the relative thermal isolation of the diode bars 30, 30'. A tremendous advantage of this configuration, however, is the parallelism of the diode bars 30, 30' which enhances their transmission efficiency.

Figure 3:
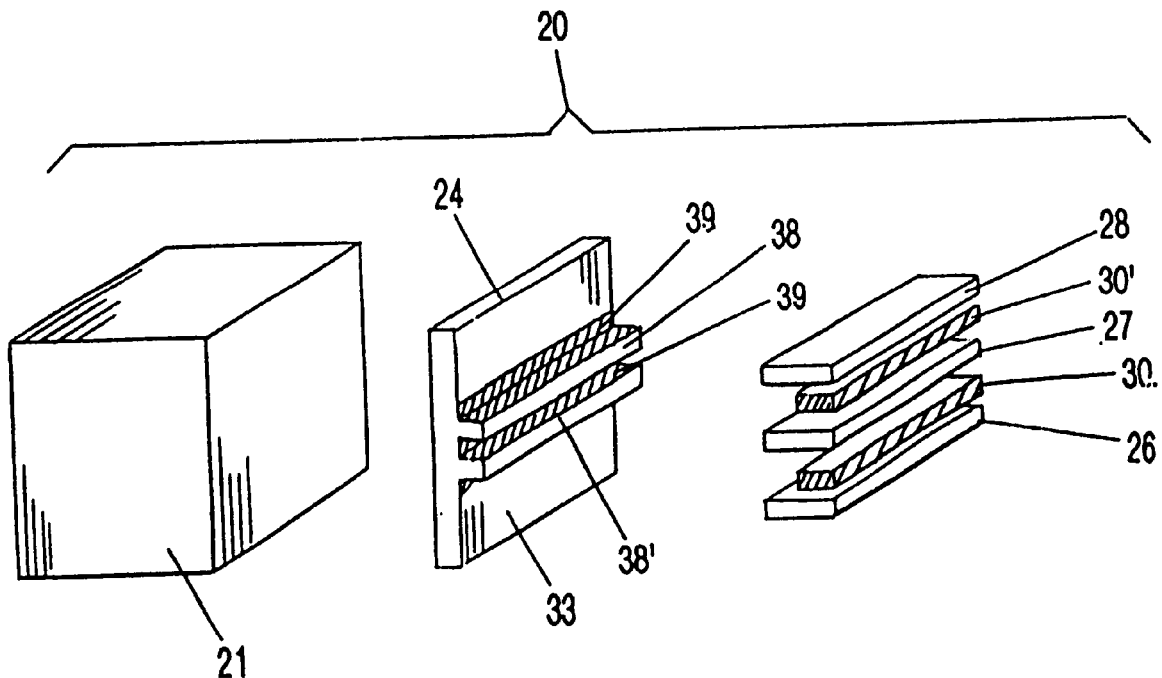
FIG. 3 is an exploded view of another version of the stacked array embodiment of the diode bar assembly according to the invention.
Figure 4:
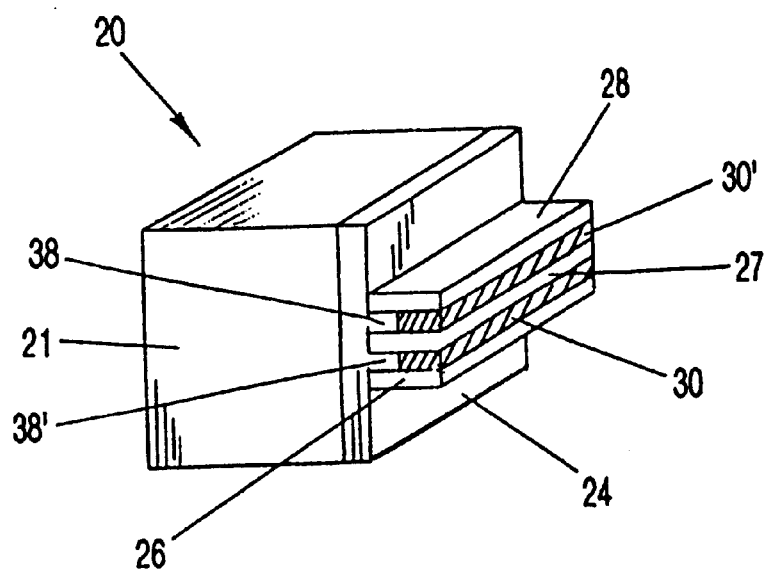
FIG. 4 is a perspective view of the assembly shown in FIG. 3, illustrating the completed assembly.

FIGS. 3 and 4 illustrate another version of the stacked array embodiment of the inventive diode assembly 20. The component parts and arrangement are substantially similar to the version shown in FIGS. 1 and 2, except that the heat spreader base substrate 24 is alternatively configured. As shown in FIG. 3, the manifold 21 has the same configuration as previously described, and the diode bars 30, 30' and spacers 26, 27, 28 are arranged in the staggered alternating configuration with the wider spacers extending laterally beyond the sides of the diode bars facing the substrate 24.

In this alternative embodiment, the heat spreader substrate 24 is provided with at least one, preferably a plurality, of separator fins 38, 38'. Separator fins 38, 38' preferably are constituted from the same electrically non-conductive material as the substrate 24 itself; most preferably, the substrate is machined to define the fins as integral extensions of the substrate. The separator fins 38, 38' correspond in number to the number of diode bars 30, 30' to be mounted. As shown in FIG. 3, the separator fins 38, 38' are parallel and extend generally perpendicular from the mounting face 33 of the substrate 24. The width of the fins 38, 38', i.e., the distance the fins extend from the mounting face 33, is approximately equal to the difference in widths between the diode bars 30, 30' and the spacers 26, 27, 28. Thus, the fins 38, 38' can fully occupy the gaps between the extended edges of the spacers 26, 27, 28 when the edges of the spacers are brought into contact with the mounting face 33 of the substrate 24, as further explained hereafter.

As best illustrated by FIG. 3, the sides of the fins 38, 38' (i.e. the fin surfaces perpendicular to the face 33) are coated with a thin conductive layer 39, preferably gold, which may be deposited by sputtering or other known coating methods. Notably, the distal, exposed ends of the fins 38, 38' are not coated with a conductive layer, but instead remain uncovered and thus electrically non-conductive. The conductive layer 39 also is provided upon the mounting face 33 along a strip thereof immediately adjacent to both sides of each fin 38, as illustrated in FIG. 3. The strip of conductive layer 39 (e.g. sputter-coated gold) on the face 33 corresponds in width generally with the thickness of a spacer 28, so that the edge of a spacer may contact and substantially cover the conductive layer 39.

FIG. 4 shows this second version of the stacked array embodiment of the assembly 20 in a fully assembled condition. As mentioned, the spacer-diode bar subassembly, comprising the spacers 26, 27, 28 alternated with the diode bars 30, 30' may be prepared first by compressing the spacers and diode bars in their stacked arrangement and then heating the subassembly to flow the solder on the spacers to contact the metalized surfaces of the diode bars. Upon cooling of the subassembly, it can be handled as a unit and attached to the heat spreader substrate 24.

The assembly 20 is finished by bringing the spacers 26, 27, 28 into contact with the conductive layer 39 on the mounting face 33 and separator fins 38, 38'. As seen in FIG. 4, the separator fins 38, 38' are inserted into the space between the spacers 26, 27, 28 until the ends of the fins contact the edges of the diode bars 30, 30'. With the spacers 26–28 so positioned, the spacers are in physical and electrical contact with the conductive layer 39 on the face 33 and the fins 38, 38'. The assembly may then be heated to flow the solder on the spacers and/or the conductive layer 39, thereby securing the spacers to the fins 38, 38' and mounting face 33.

When assembled as depicted in FIG. 4, this version of the stacked array embodiment of the laser diode assembly 20 functions very similarly to the version previously described.

Notably, the distal ends of the separator fins 38, 38' are in physical contact with the laser diode bars 30, 30'. This contact offers the significant added advantage of enhanced heat transfer from the diode bars 30, 30' directly to the heat spreader substrate 24, as thermally energy flows directly from the diode bars into the fins. Thermal energy is then carried from the fins to the manifold 21. Because the distal ends of the fins are not covered with any of the conductive layer 39, there is no electrical contact between the diode bars 30, 30' and the substrate. The physical contact of the fins 38, 38' with the diode bars 30, 30' promotes the structural integrity and durability of the overall assembly 20.

The electrical flow is essentially as previously described. A circuit can be completed through the diode bars 30, 30' due to the electrical conductivity of the spacers 26–28, the conductive layer 39, and the metalized contacts on the diode bars themselves.

In lieu of conventional soldering methods, the apparatus 60 of the invention may be integrated using other bonding methods. For example, the diode bars 30, 30' may be bonded to the conductive layers 34 or 39 using an atomic welding process. The atomic welding process relies upon the exothermic reaction of the monatomic hydrogen (Brown's Gas) combining into diatomic hydrogen to generate the bond between two adjacent materials. This process may be used for joining two widely dissimilar materials to one another, due to the atomic level energy interactions that take place during the exothermic reaction. Thus, materials having widely dissimilar physical characteristics, such as the electrically non-conductive heat spreader base 24 and the electrically conductive plate 34 may be joined by atomic welding. Similarly, it may be desirable to bond the diode bars 30, 30', 30" directly to a beryllium substrate by atomic welding.

Figure 5:
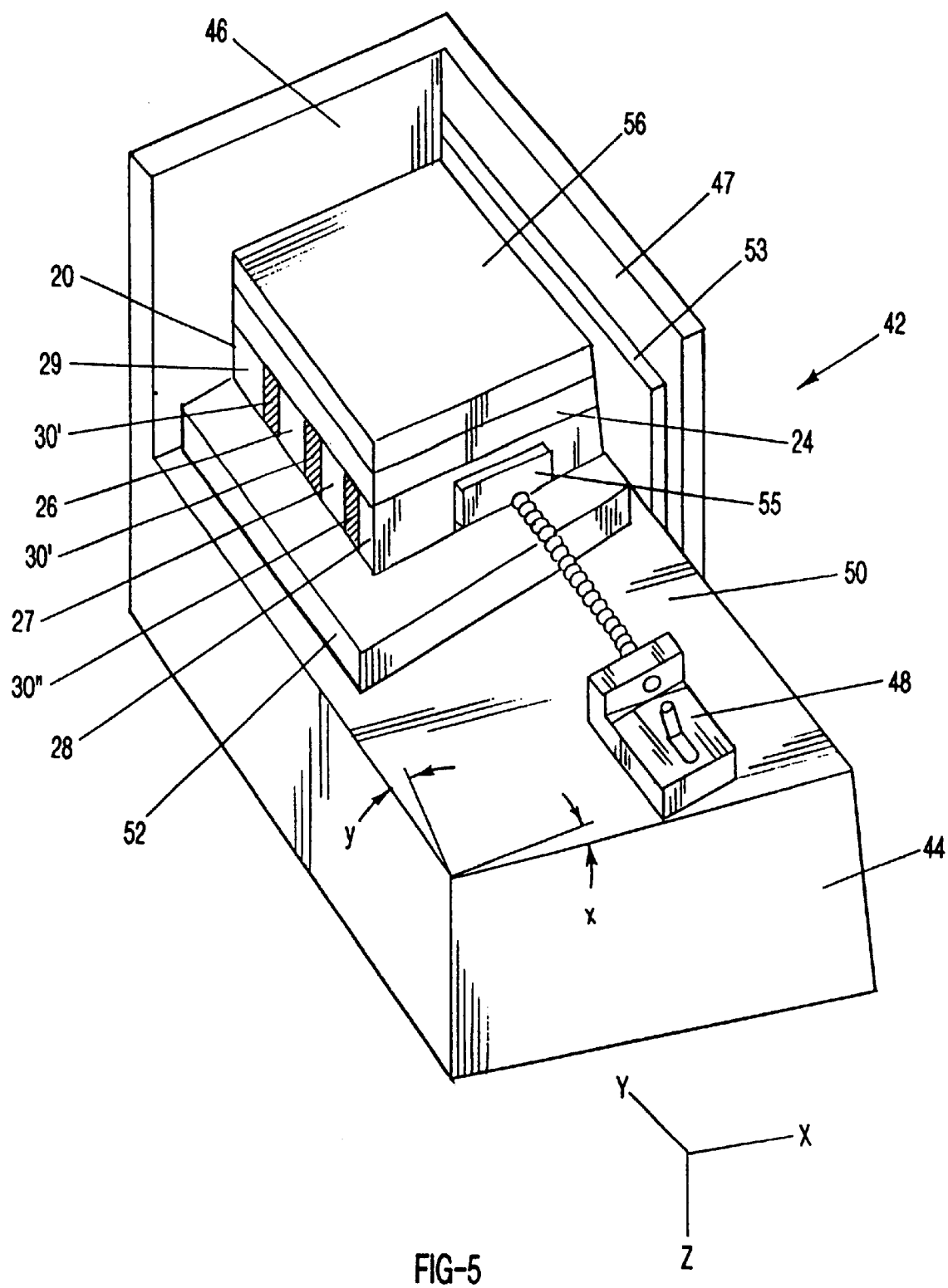
FIG. 5 is a perspective view from above of a jig apparatus according to the invention for assembling the assemblies shown in FIGS. 1–4.

Attention is invited to FIG. 5, showing an assembly jig 42 according to the present invention, which is useable for assembling the stacked array embodiments of the diode bar assembly 20. The assembly jig 42 is a means for precisely aligning and interconnecting the spacers 26–28 and the diode bars 30, 30', 30". The proper alignment is achieved by compressing the spacers and the diode bars together while situating them against specially tilted planar surfaces.

The jig assembly 42, is somewhat larger in size than the diode bar assembly 20 to be manufactured. Jig assembly 42 includes a jig table 44, back wall 46, side wall 47, and clamp 48. The jig table 44 defines a working surface 50 upon which the subassembly of diode bars 30, 30' is accomplished. The working surface 50 is machined to be planar with a minimum of warp or wave. Preferably, the working surface is tilted in two axes. The tilted disposition promotes, by the force of gravity, the proper alignment of the spacers 26–28 and diode bars 30, 30' in the assembly jig 42. As shown in FIG. 5, the working surface 50 is tilted toward the side wall 47 at a small angle x (for example, but not by way of limitation, between approximately one and ten degrees) with respect to horizontal. The working surface 50 of the jig table 44 preferably also is tilted toward the back wall 46 at a small angle y (for example, between approximately one and approximately five degrees) with respect to horizontal. Accordingly, the working surface 50 has an overall pitch or cant toward the inside corner defined by the intersection of the working surface, the back wall 46, and the side wall 47. Items placed upon the jig table 44 tend, therefore, to slide or roll by the force of gravity toward both walls 46, 47.

The back and side walls 46, 47 preferably but not necessarily are perpendicular to the tilted working surface 50, alternatively, and for simplicity of construction, the walls 46, 47 may be vertical. During the practice of the invention, the walls 46, 47 are fixed in position in relation to the jig table 44.

Two plates of microscope glass 52, 53 are used in the practice of the invention to provide for extremely smooth, flat, low-friction surfaces against which the diode bar-spacers subassembly may be compiled. One glass slide 52 rests upon the working surface 50 with its edges abutting the walls 46, 47, while the other 53 stands flush against the side wall 47 with its edges against the working surface 50 and the back wall 46.

The assembly jig 42 also includes a clamp 48. Clamp 48 provides a means for applying a compressive force acting toward and against the back wall 46. As seen in FIG. 5, therefore, the clamp 48 is used to controllably push the diode bar-spacers subassembly against the back wall 46, thereby to compress together the spacers 26–28 and diode bars 30, 30'. The clamp 48 may take any number of forms, and may be, for example, spring-loaded or screw-actuated. A tension spring embodiment may involve the use of helical springs to pull a push pad 55 toward an immobile anchor on or in the back wall 46; alternatively, a threaded screw rod or compression/tension spring combination may be incorporated to push the push pad 55 toward the back wall 46 from an anchor fixed in relation to the immobile jig table 44. Any number of suitable clamping arrangements are available to one of ordinary skill in the art.

One method of assembling a stacked array embodiment of the diode assembly 20 apparatus of the invention may now be briefly described. The diode bars 30, 30' preferably are kept in a clean room environment and are handled only with a vacuum chuck having a soft silicon tip or other means for manipulating without damaging the diode bars. The diode bars 30, 30' preferably are stored in a vacuum or nitrogen environment to prevent oxidation of the diode bar metalization. Oxidized metalization layers on the diode bars may interfere with reliable bonding during soldering processes.

The diode bars 30, 30' preferably are cleaned prior to assembly, such as ultrasonically with trichloride. If the diode bars are stored in a gel-pack, it is preferred to remove them by pulling a vacuum on the back side of the gel-pack to release the diode bars. The diode bars are then removed using a vacuum chuck.

The spacers 26, 27, 28 preferably are stored in dry nitrogen. The spacers are cleaned prior to assembly with a suitable cleanser, such as hydrochloric acid, and then rinsed, first with deionized water and then with isopropyl alcohol.

Referring collectively to FIGS. 1–5, the clean microscope glass 52, 53 is situated flush against the two walls 46, 47. The spacers 26, 27, 28 and diode bars 30, 30', 30" are placed in an alternating pattern in the assembly jig 42. While FIG. 5 illustrates the use of four spacers 26, 27, 28, 29 and three diode bars 30, 30', and 30", it is understood that any number of diode bars, according to user preference, can be stacked with a spacer between each diode bar. The diode bars 30, 30' are disposed on the working surface 50, with the emitter sides of the diodes facing down in contact with the glass 52. Thus, the long edges of the diode bars and spacers rest upon the microscope glass 52 on the working surface 50 of the jig table 44. The long side of a first spacer 26 is placed flush against the back wall 46. The short ends of the diode bars 30, 30' contact the other microscope glass 53, and the bars 30, 30', 30" and spacers 26, 27, 28, 29 are loaded in an alternating pattern, each in flush contact with adjacent components. Due to the tilt of the working surface 50 toward the side wall 47, gravity mildly forces the narrow ends of the spacers 26–29 and the narrow ends of the diode bars 30, 30', 30" against the glass 53 on the side wall 47, thereby aligning those components with respect to the x-axis shown. The tilt of the working surface 50 toward the back wall 46 similarly causes the diode bars 30, 30', 30" and spacers 26–29 to fall flush against one another thereby promoting alignment with respect to the y-axis shown.

The clamp 48 is then actuated to press the stacked array of spacers and diodes toward the back wall 46, with the result that the spacers and diode bars are squeezed between the push pad 55 and the back wall 46. This compression effectively promotes parallelism of the diode bars 30, 30', 30" and fosters excellent bonding between the spacers 26–29 and the diode bars.

With the spacers 26–29 and diode bars 30, 30', 30" thus clamped in the assembly jig 42, the electrically non-conductive heat spreader substrate 24 is then disposed upon the stacked diode bar-spacers subassembly. In the version of the assembly 20 featuring a grooved substrate 24 (FIGS. 1 and 2), the grooves 32, 32' are aligned with the diode bars so that the diode bars do not contact the heat spreader substrate 24. The physical separation of the diode bars 30, 30', 30" from the substrate 24, due to the presence of the grooves 32, 32' and the support provided by the spacers 26, 27, 28, 29 eliminates solder bridging between adjacent diode bars that would lead to electrical shorts between bars. The top edges of the spacers 26–29 positively contact the conductive layer 34, however, and the substrate is thus supported upon the spacers, as seen in FIG. 5. In the case of the finned version of the assembly 20, the fins 38 are inserted between the spacers 26–29, and the substrate 24 rests upon the diode bars 30, 30', 30" as well as the spacers. As mentioned, however, only the spacers 26–29 are in electrical contact with the conductive layer 39 (FIG. 3).

A small weight 56 having a flat face then is placed, flat face down, on top of the heat spreader substrate 24 as shown in FIG. 5. The weight 56 pressing downward upon the clamped spacers and diode bars improves the bonding of the assembly 20. It will be evident to one of ordinary skill in the art that alternative modes of pressing downward, besides the use of a weight, may be employed. Any suitable equivalent means of controllably compressing the sub-assembly against the working face 50 of the jig will also suffice, such as the use of a spring-loaded or screw-driven clamp.

The assembly jig 42, together with the diode bar assembly 20, is then placed into a vacuum heat chamber, for example at about 280° C. (to melt an 80/20 gold-tin solder) for approximately ten minutes. The temperature and time may be varied depending upon the solder type. The clamp 48 holds the components in parallel alignment during heating. The heat of the chamber melts and flows the solder between the spacers 26–29 and the conductive layer 34 or 39 on the substrate 24, and between the spacers and the diode bars 30, 30', 30". Upon removal from the chamber and cooling, therefore, the solder bonds together the components of the assembly 20, with the diode bars 30, 30', 30" electrically interconnected via the spacers 26–29. The clamp 48 may then be released. Electrical leads (not shown) can then be soldered or otherwise electrically connected to the end spacers 26, 29 of the stacked assembly 20 using a solder having a melting point lower than the solder used to bind the assembly itself.

Finally, the assembly 20 is electrically connected to a power supply and tested for temperature versus wavelength, and electrical power input versus optical power output. If any of the individual diode bars 30, 30', or 30" are determined to fall below specification, the assembly 20 may be re-heated to re-melt the solder cement, and the defective diode bar(s) removed and replaced.

The use of stacked array laser diode assemblies according to the invention permits the process and apparatus to be modularized. In modular laser diode assembly, diode bars are individually processed and then affixed to the substrate. Modularized assembly is beneficial, as it permits more accurate and particularized placement of the diode bars, as well as testing and replacement on a specific basis rather than in gross.

Figure 16:
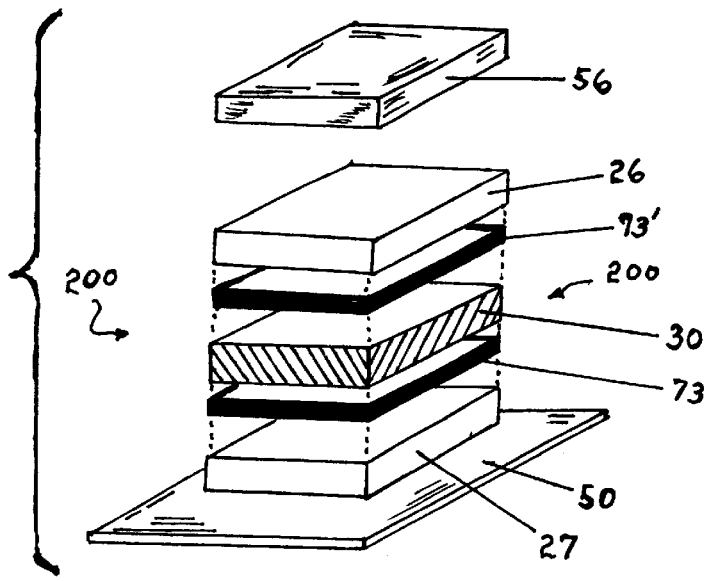
FIG. 16 is an exploded perspective view of a diode bar submodule; which is assembled by one method according to the present invention.
Figure 17:
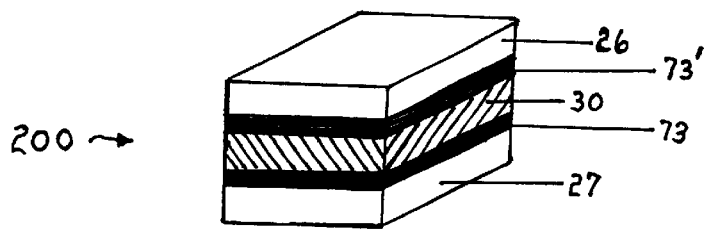
FIG. 17 is a perspective view of the submodule depicted in FIG. 16, shown in an assembled condition.
Figure 18:
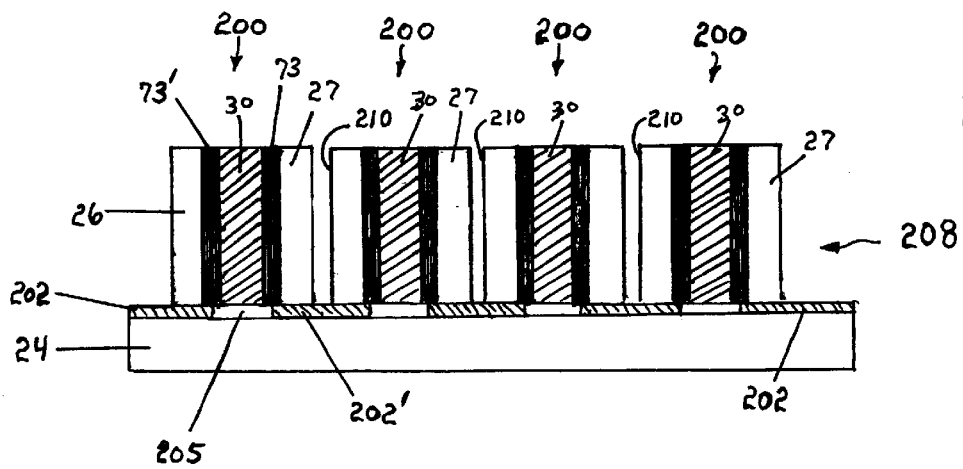
FIG. 18 is a side view of a diode bar array, including a plurality of diode bar submodules like the submodule of FIG. 17, that is assembled according to a method according to the present invention.

Attention is invited to FIGS. 16–18, which illustrate the modularized laser diode assembly according to the present invention. According to this aspect of the invention, a laser diode assembly is constructed of a plurality of sub-modules 200 attached to a common substrate 24, as best seen in FIG. 18. This aspect of the invention is similar, in many of its overall aspects and components, to the stacked array embodiment seen in FIGS. 1–4, and the foregoing discussion of that embodiment will inform the disclosure of the method and apparatus of the modularized diode assembly and array disclosed hereafter.

FIG. 16 indicates the mode of manufacture of a single submodule 200. The sub-module is manufactured in a manner similar to that described above for stacked arrays generally, i.e., by stacking in generally horizontal strata. A working surface 50 (optionally tilted as described above) is provided upon which the submodule 200 is assembled. The assembly is similar to the construction of a sandwich. A conductive spacer 27 is placed flush upon the working surface 50. A solder preform 73, comprised of a strip or square of thin, pre-formed solder cut to correspond generally in lateral size to the spacer 27, is placed flush upon the spacer 27. The spacer 27 is sized to correspond generally to the laser diode bar 30. A second solder pre-form 73' is then placed upon the top surface of the laser diode bar 30, and a second spacer 26 is placed upon the solder preform 73' to cap off the submodule 200.

The entire submodule 200 arranged as shown in FIG. 16, thus is situated upon the working surface 50. A weight 56 is then disposed upon the stacked submodule 200 to provide a downward force tending to compress together the various components of the submodule 200. The stacked submodule 200 (which when properly arranged will appear substantially as indicated in FIG. 17) while disposed between the working surface 50 and the compressive weight 56, may then be placed in an oven, where the temperature is elevated to melt the solder preforms 73, 73' and thus bind the spacers 26, 27 to the diode bar 30. The weight 56 is selected to provide the desired compressive force to squeeze the submodule 200 together during the melting of the solder preforms 73, 73'. After the solder preforms 73, 73' have melted, the submodule 200 is cooled to permit the solder to harden and thereby bond the main elements 26, 30, 27 of the submodule together.

Advantageously the submodule 200, thus assembled and as appearing in FIG. 17, can then be separately tested to determine or confirm its individual optical characteristics. Submodules not passing predetermined performance standards may then be rejected or re-manufactured prior to incorporation into a full laser diode bar array 208, such as that shown in profile in FIG. 18. According to the invention, therefore, no substandard submodule 200 need be incorporated into an array 208, as submodules 200 may be pre-tested, either individually, or by using statistical sampling methodologies, at the time of submodule manufacture but prior to the completion of an array.

A laser diode array 208 according to the invention including a plurality of substantially identical submodules 200 is depicted in FIG. 18. A plurality of submodules 200 is disposed upon a pre-tinned thermal substrate 24 to accomplish the assembly of a diode array 208. Substrate 24 is provided with pre-applied strips of solder 202, 202' each pair of solder strips 202, 202' separated by a uniform gap 205. The solder strips 202, 202' are fashioned from a solder having a melting point substantially lower than the melting point of the solder pre-forms 73, 73' used to bond the submodule 200 together as described above. Each submodule 200 is placed upon the pre-tinned substrate 24 so that the diode bars 30 are positioned above, and aligned with, a corresponding gap 205 in the substrate solder 202, 202'. The solder strips 202, 202' do however, contact the solder layers 73, 73' of each submodule 200, permitting electrical flow through the diode bar 30.

As indicated in FIG. 18, a plurality of submodules 200 are thus arranged in physical parallel relation upon the pre-tinned substrate 24, and there held in position, as by robotic clamping or the like. The submodules 200 do not touch each other, but rather are separated by a series of parallel separation gaps 210. With the plurality of parallel submodules 200 held in place against the substrate 24 so that the conductive preforms 73, 73' are in electrical contact with the solder strips 202, 202', but the diode bars 30 are not, the entire array 208 may be heated to a temperature in excess of the melting point of the solder strips 202, 202' but below the melting point of the solder preforms 73, 73'. The melting of the solder strips 202, 202' occurs to bond the several submodules to the substrate 24 in the appropriate arrangement seen in FIG. 18. Upon the cooling of the array 208 to harden the solder strips 202, 202', the submodular laser diode array 208 is ready for further testing or incorporation as a component of larger devices. Advantageously, each submodule 200 in an array 208 may be individually removed and replaced as needed by simply heating and re-heating the corresponding portion of the substrate 24 to melt the selected strips 202, 202' adjacent the submodule to be replaced.

Thus, the present invention includes the foregoing method for assembling a diode bar assembly. An aspect of the method is the construction of a plurality of diode submodules 200, each submodule 200 assembled by locating the first conductive spacer 27 upon a planar working surface 50, disposing the first solder preform 73, having a melting temperature, upon the first conductive spacer 27, placing the diode bar 30 upon the first solder preform 73, disposing the second solder preform 73' having a melting temperature upon the diode bar 30, placing the second conductive spacer 26 upon the second solder preform 73, compressing the spacers 26, 27, preforms 73, 73' and diode bar 30 parallel together, heating the solder preforms 73, 73' above their melting temperatures, and then allowing the melted solder preforms to harden by cooling, thereby bonding the spacers 26, 27 to the diode bar 30. The spacers 26, 27 bonded to the diode bar 30 define a diode submodule 200. The step of compressing may involve disposing a selected weight 26 upon the second spacer 26, although alternative known methods of compressing the submodule 200 are within the scope of the invention. The step of heating preferably includes placing the submodule 200 in a controlled heat source while compressing the spacers 26, 27, solder pre-forms 73, 73' and diode bar 30.

The inventive method extends to the assembly of a plurality of submodules 200 into a diode bar array 208, by the step of affixing a plurality of diode submodules, prepared as described above, upon the substrate 24, the substrate being provided with a plurality of conductive strips 202, 202'. After the affixing step, the conductive strips are in electrical contact with respective solder preforms 73, 73', and the plurality of submodules affixed to the substrate 24 define the diode bar array 208. The plurality of conductive strips 202, 202' preferably are made from solder having a melting temperature less than the melting temperatures of the solder preforms 73, 73'. The step of affixing includes the steps of heating the array 208 to a temperature between the melting temperature of the conductive strips 202, 202' and the lowest melting temperature of the solder preforms 73, 73', (consequently melting the conductive strips but not the solder preforms), and then allowing the conductive strips to harden by cooling, thereby bonding the submodules 200 to the substrate 24. Alternatively, where the plurality of conductive strips 202, 202' are strips of solder pre-applied to the substrate 24, the step of affixing may include the step of applying epoxy glue between the submodules and the substrate.

The overall method for assembling a diode bar array, thus includes in its ambit the steps of: (a) locating the first conductive spacer upon the planar working surface; (b) disposing the first solder preform, having a melting temperature, upon the first conductive spacer; (c) placing the diode bar upon the first solder preform; (d) disposing the second solder preform upon the diode bar; (e) placing the second conductive spacer upon the second solder preform; (f) compressing the spacers, preforms and diode bar parallel together, preferably by placing a weight upon the stacked components; (g) heating the solder preforms above their melting points; (h) allowing the melted solder preforms to harden by cooling to bond the spacers to the diode bar to fashion a diode submodule; and (i) affixing a plurality of diode submodules upon a substrate, the substrate being provided with a plurality of conductive strips, wherein after affixing the conductive strips are in electrical contact with respective solder preforms. The situation of the plurality of submodules against the substrate may be accomplished using robotic devices known to the manufacturing art, to permit rapid and precise location prior to affixation.

Figure 6A:
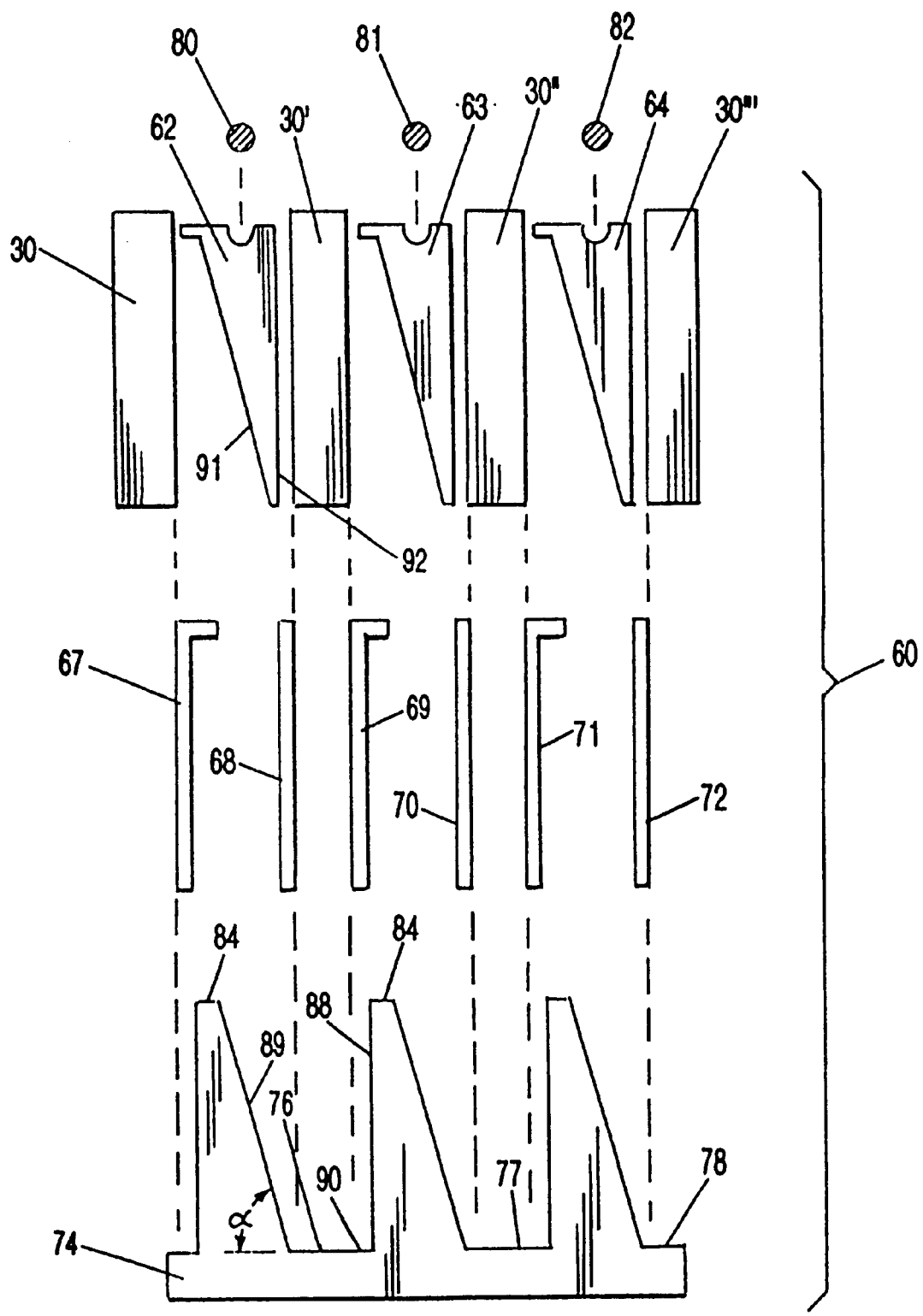
FIG. 6A is an exploded view of one version of the wedged array embodiment of the diode bar assembly according to the present invention.
Figure 6B:
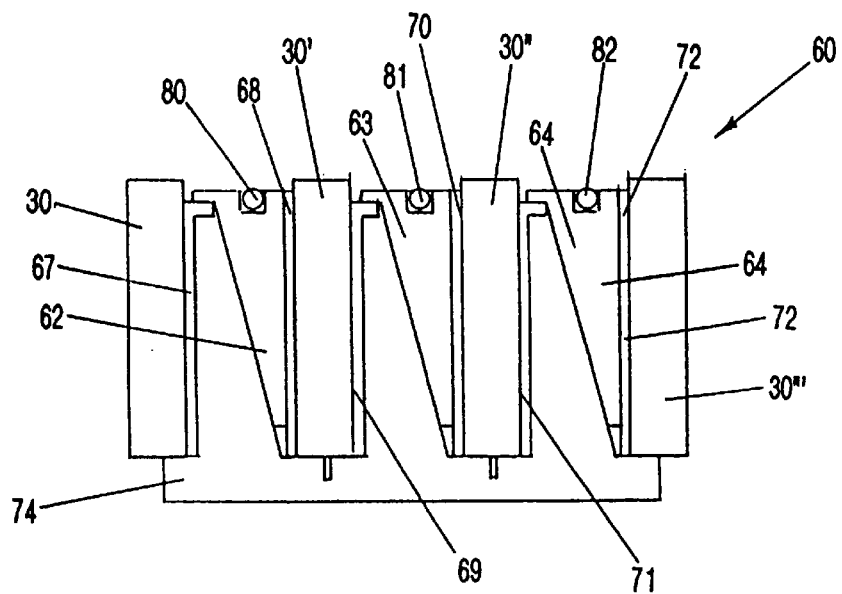
FIG. 6B is an end view of the assembly depicted in FIG. 6A, shown fully assembled.
Figure 7:
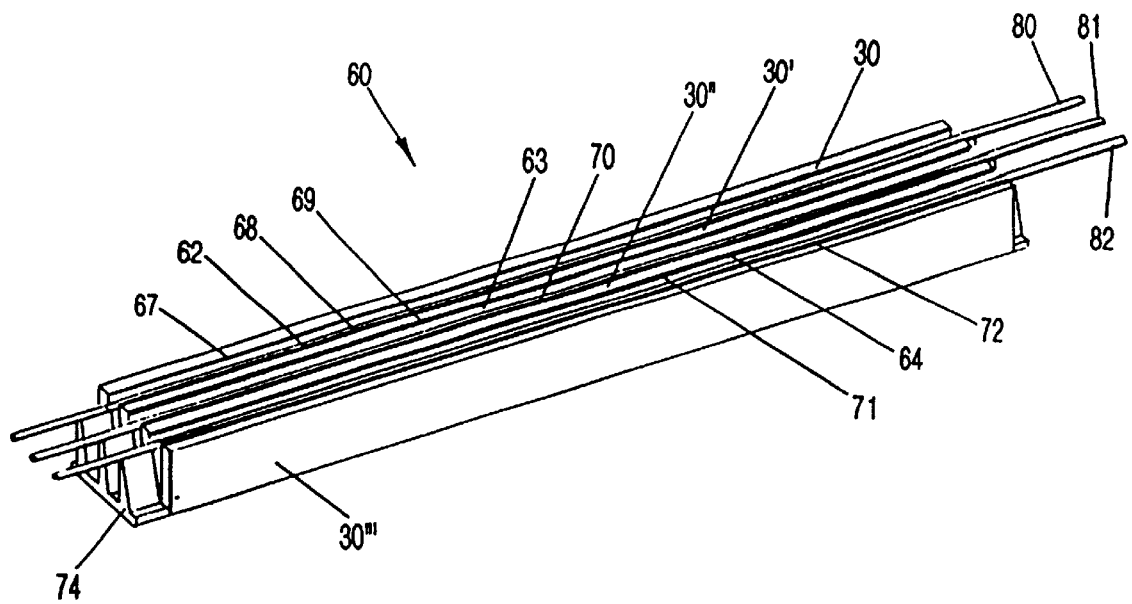
FIG. 7 is a perspective view, from above, of the assembly shown in FIG. 6B.

An alternative embodiment of the invention is the laser diode assembly apparatus 60 depicted in FIGS. 6A, 6B and 7. This assembly 60 is a "wedged array" assembly, wherein individual wedges are used (instead of external compression, such as from a jig) to force the diode bars into proper parallel alignment. The wedged array embodiment has four principal types of components: A base substrate, conductor strips, wedges, diode bars, and tension wires.

In this embodiment, a series of small wedges are inserted into a tapered groove and pulled down into position against am associated series of diode bars. Applicants have successfully manufactured the wedges and coated them with a desirable thickness of indium.

The base substrate 74 is fashioned from substantially the same material, for example beryllium oxide, and serves most of the same functions as explained herein for the heat spreader base substrate 24 included in the stacked array embodiment (FIG. 1) of the invention. The base substrate 74 of the wedged array is machined or otherwise formed to specified shapes as explained herein. The conductive strips 67, 68, 69, 70, 71, 72 may be made from a variety of materials and assume a variety of different shapes. The shapes and numbers of conductive strips 67–72 illustrated in FIGS. 6A and 6B are disclosed as a useful example, but not by way of limitation. The conductive strips 67–72 serve as a means for providing electrical contact and connection between adjacent diode bars, for example between diode bar 62 and bar 63, or between bar 63 and bar 64 shown in the drawings. The conductive strips 67–72 in one embodiment are thin strips of bendable, electrically conductive metal alloy, for example indium solder, which are separately fashioned for insertion into the grooves 76, 77, 78 as shown in FIGS. 6A and 6B. Alternatively, the conductive strips 67–72 may be deposited on the key surfaces of the substrate 74 by a vapor or sputter coating or deposition of indium solder or other conductive metal.

The wedges 62, 63, 64 are comprised of copper or other electrically conductive material. The wedges 62, 63, 64 serve a primarily structural function, and therefor need to be substantially rigid and non-compressible. However, they also are electrical contacts, and must either be made from a conductive material or be coated with a conductive layer by any suitable method.

The diode bars 30–30''' are of the same type as described for the stacked array embodiment of the invention, and are commercially available. Each bar has a principal surface from which the laser energy is emitted. This wedged array embodiment of the invention 60 allows a plurality of bars to be reliably aligned in parallel arrays to enhance array performance, particularly to minimize wave front distortions. The tension wires 80, 81, 82 are used to force the wedges 62–64 into corresponding grooves 76–78 in the substrate 74 and maintain their position during heating of the assembly 60.

FIG. 6A is an exploded end view of a single assembly 60, depicting how, in one embodiment, the various components are positioned to complete the assembly shown in end view in FIG. 6B and in perspective view in FIG. 7. In the illustrated example, the assembly includes three conductive wedges 62, 63, 64, four laser diode bars 30, 30', 30'' and 30''', and six conductive strips 67, 68, 69, 70, 71, 72 which are mounted upon a specially configured base substrate 74. It is understood, however, that various versions of the assembly 60 according to the invention can have various numbers of these components according to the intended use and desired specification of the apparatus. As best illustrated in FIG. 6A, the wedges 62–64, diode bars 30–30''' and conductive strips 67–62 are disposed into shaped grooves 76, 77, 78 in the base substrate 74. As shall be further explained, wires 80, 81, 83 corresponding in number to the number of diode bars are used to hold the assembly 60 together during manufacture.

The base substrate 74 features a major surface 84 having at least one, preferably a plurality of grooves 76, 77, 78 therein. The grooves are substantially identical in configuration, except that outside groves (e.g. groove 78) may have one side wall defined by an adjacent second substrate (not shown) or some other support member. Description of one groove 76, and the components 62, 68, 30', and 69 that are insertably disposed therein serve to describe like grooves and components situated parallel in the substrate 74 as shown. Each groove, for example groove 76, is defined by a first wall 88 and a second wall 89, these walls 88, 89 being nonparallel and converging toward a bottom 90 of the groove, as best seen in FIG. 6A.

Combined reference to FIGS. 6A and 6B shows that a diode bar 30' is disposed vertically into the groove 76 with its emitter surface upward so as to be proximate to the major surface 84 and therefor free to emit energy away from the major surface 84 of the substrate. A conductive wedge 62 is placed in electrical contact with the diode bar 30' and forcibly inserted into the groove 76 between the diode bar 30' and the second wall 89, thereby pressing the diode bar against the first wall 88. This pressing action fosters optimum alignment of the diode bar 30' and, when repeated for the diode bars (e.g. 30'', 30''') in each of the respective other grooves (77, 78) promotes parallelism between diode bars for maximum efficiency of the assembly 60. As mentioned, the inventive apparatus may feature a single groove with a diode bar and wedge therein, or, preferably, a plurality of diode bars disposed within corresponding ones of a plurality of grooves, with each groove defined by a first wall and a second wall, the walls being nonparallel and converging toward a bottom of each groove. As seen in FIGS. 6A, 6B and 6B, each first wall 88 preferably is perpendicular to the major surface 84 of the substrate 74. Also preferably, the second wall 89 is inclined in relation to the major surface 84 and intersects the bottom 90 of the groove at an angle $\alpha$.

The wedge 62 preferably has a first face 91 and a second face 92 intersecting at an angle substantially equal to the geometric complement of angle $\alpha$, (i.e. $90°-\alpha$). Accordingly, when a wedge 62 is pressed between the second wall 89 and a diode bar 30' previously disposed into the groove 76, the first face 91 slides in flush contact along the second wall 89 of the groove 76, and the wedge pushes the diode 30' firmly and flush against the first wall 88 of the groove. The result is an optimally aligned diode bar 30'. As best seen in FIG. 6B, a small channel optionally may be centrally provided in the butt of each wedge 62 to receive and hold a tension wire 80.

The process for assembling a wedged array assembly 60 is explained. In one embodiment, the conductive strip 69 on the first wall 88 of the groove 76 is previously deposited or sputter-coated upon the first wall 88; alternatively and in many instances preferably, the conductive strips, for example, strips 67, 68, 69 pertaining to the groove 76 are separately shaped, as shown in FIGS. 6A and 6B, from thin conductive bands of malleable alloy. The base substrate 74 first is positioned and temporarily secured onto any suitable rigid mounting surface or fixture. The strips 67, 69 and 7i are laid in against the first walls 88 of the grooves. The diode bars 30, 30', 30'', 30''' are then disposed into the respective grooves until the diode bars bottom in the grooves, with the bars resting against the first-laid strips 67, 69, 71. While the conductive character of the wedges and the metalized coating on the diode bars may obviate the need, it may be desirable next to place the second set of conductive strips 68, 70, and 72 against the diode bars to promote complete bonding of the assembly 60 and electrical contact between the wedges and the diode bars. With the conductive strips 68, 70 and 72 resting upright against the diode bars, the wedges 62, 63, 64 are placed in position into the space between the second-laid strips 68, 70 and 72 and the second faces 88 of the several grooves (e.g. 76, 77, 78). The process of inserting a strip 69, then a diode 30', then a strip 68 and then a wedge 62 is repeated until all the grooves are populated, although it is understood that with the proper equipment the process may be accomplished for two or more grooves simultaneously.

With the grooves populated with diode bars, conductive strips, and conductive wedges, the tensioning wires 80, 81, 82 are situated upon the butts at the tops of the wedges as shown in FIG. 6B. The tensioning wires 80, 81, 82 may be laid into small channels cut into the butts of the wedges, if desired, to provide a means for maintaining the wires in proper aligned position for forcing the wedges. With the wires in place upon respective ones of the wedges 62, 63, 64, tension is applied to the wires to push the wedges downward into the grooves 76–78. A sufficient tension is applied by any appropriate external means to drive the wedges downward, with the first face 91 of each wedge 62 riding down the second wall 89 of each groove 76; in many instances, any given wedge 62 will move downward under the force applied by the tensioning wire 80 until the tip of the wedge bottoms against the bottom 90 of the groove 76. However, this is not necessarily the case, as the object is to securely press the diode bar 30' firmly against the first wall 88, and the tension applied to the wire 80 is that sufficient to accomplish this purpose. During this step of the process, a suitable temporary external vertical support (not shown) may be supplied to hold the outside diodes 30, 30''' to hold them in place against lateral shifting.

FIG. 7 shows how the completed assembly 60 may appear when completed and prepared for soldered bonding. The entire assembly 60 then is placed into an appropriate oven or other controlled heat source. While the tension is maintained upon the wires 80, 81, 82 to maintain the wedges and diode bars in alignment, the heat source is activated to melt the conductive strips 67–72 and inter-bond the entire assembly 60. Upon cooling to harden the solder cement, the tensioning wires may be removed.

Other shapes of strips 67, 68, 69 are possible without departing from the scope of this invention. For example, the strips 67 and 69 may be formed from a single integral strip bent into the shape of an "N", with an additional section (not shown) extending from the top of strip 67 to the bottom of strip 69 and which lays along the second wall 89 of the groove 76. Such an N-shaped integral strip then could be laid into the groove 76, with the section strip 67 against the first wall of the first groove, the intermediate strip section along the second wall 89 of the second groove 76, and the section strip 69 laid in against the first wall 88. The diode bar 30' is then placed, another strip (i.e. 68) is laid in separately against the bar 30, and the wedge inserted between the intermediate section of the N-shaped strip and the second strip 68.

Due to the small size of the wedges 62, 63, 64 and diode bars 30–30''', and the requirement that small conductive strips 68, 70, 72 preferably are installed between the diode bars and the first walls (e.g. 88) of the grooves in the substrate 74, the final assembly optionally may be facilitated by manipulating the wedges and diode bars as a single unit. In lieu of an assembly process including insertion of a diode bar followed by insertion of a wedge, the wedge 62 and diode bar 69 may be assembled as a unit. The secondary conductive strip 69 is bonded on the side of the diode bar opposite the wedge 62 during the process of bonding the wedge and diode bar together. This allows the assembly process to consist of simply disposing the wedge/diode bar/conductive strip sub-assemblies into the provided groove (e.g. 76).

It is observed, therefore, that the conductive strip 69 functions as a means for providing serial electrical contact between diode bar 30' in the groove 76 and diode bar 30' in the adjacent groove 77, since the strip 69 extends between the diode bar 30' and the conductive wedge 63, which is in electrical contact with the diode bar 30" in groove 77. The series connections between the diode bars 30', 30" is completed by the optional use of another conductive strip disposed between the wedge 63 and the inclined second wall of groove 77, and a third conductive strip 70 between the wedge and the second diode bar 30". But, as mentioned, all three conductive strips optionally can be integrated into a plurality of single conductive strips insertable into the adjacent grooves 76, 77.

In a further alternative embodiment, the wedged array assembly is assembled using the atomic welding process. If the atomic welding process is employed, no conductive coating or strips 67, 69, 71 are provided for bonding the diode bars to the substrate base 74 (e.g. aluminum nitride). Instead, the wedges 62–64 are fashioned from an electrically non-conductive material, and atomic welding utilized to bond the wedge/diode subassemblies to the substrate 74. Similarly, diode bars may be soldered into place into a nonconductive base of aluminum nitride using the atomic welding process with a conductive solder. Conductive strips are not required in this approach in order to bond the solder to the non-conductive base.

FIG. 7 shows the assembly 60 as it might appear prior to being placed in an oven chamber for soldering. The tensioning wires 80, 81, 82 are then removable subsequent to cooling.

Removal of the tensioning wires after the assembly 60 has been completed may be facilitated by providing for the insertion of very small tangs into the tops of the wedges 62–64 during their fabrication. A small cutoff block may be incorporated into the initial wire deformation mold for manufacture of the wedges, which allows the small tang to be integrated into the wedge. This permits easier handling of the wedge assemblies, with the wire being broken off at the tang after the diode assembly 60 is completed.

Figure 8:
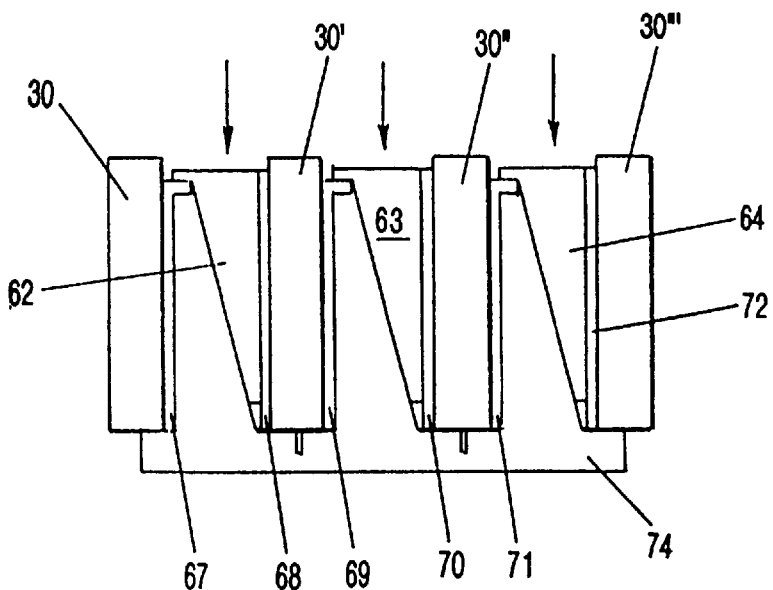
FIG. 8 is an end view of an assembled alternative version of the embodiment depicted in FIG. 6B.
Figure 9:
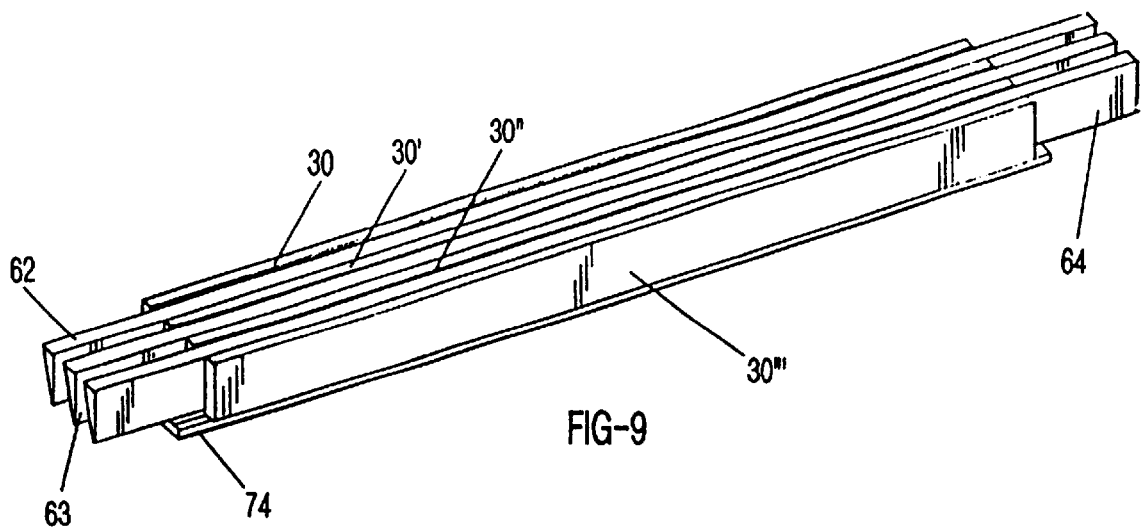
FIG. 9 is a perspective view, from above, of the assembly depicted in FIG. 8.

FIGS. 8 and 9 illustrate that the use of tensioning wires is wholly optional. Any other suitable means, such as planar clamps for simultaneously compressing down on all the wedges 62, 63, 64, discrete weights disposed upon corresponding ones of the wedges, a single large weight, or the like, may also be employed; the principal factor involved in selecting a means for forcing the wedges downward it that all the wedges be pressed into their respective grooves 76–78 at the same time, and with approximately equal force, in the direction indicated by the directional arrows of FIG. 8. FIG. 9 discloses the general appearance of an assembly 60 where tensioning wires are not employed to force the wedges into position. Instead, a clamp (not shown) for example can be used to compress the tops of the wedges 62, 63, 64 toward the bottom of the substrate 74 to maintain the assembly 60 during bulk soldering. For this purpose the wedges 62, 63, 64 may be provided with broad, planar tops as seen in FIGS. 8 and 9.

Figure 10:
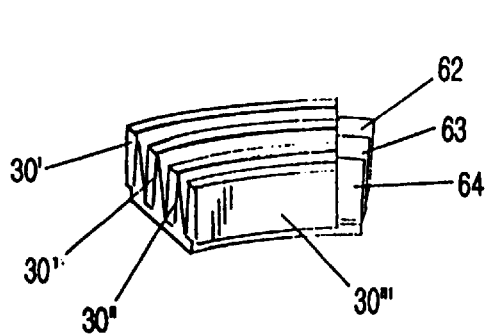
FIGS. 10 and 11 are different perspective views of an alternative embodiment of the assembly shown in FIG. 9, illustrating that the inventive assembly may be provided in curved versions.
Figure 11:
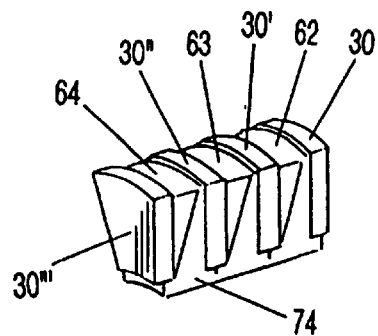

An advantageous feature of the invention, particularly of the embodiment shown in FIGS. 8 and 9, is that curvilinear assembles can be produced. In all the embodiments, the grooves 76–78 are disposed in adjacent rows. Straight, rectilinear, parallel rows (FIGS. 6A–9) are, of course, more easily machined or otherwise formed into the substrate 74, and rectilinear wedges and diode bars are more readily produced or available. In an alternative version illustrated in FIGS. 10 and 11, the rows of grooves 76, 77, 78 are parallel, but are curved. Curved wedges 62, 63, 64 and curved diode bars 30, 30', 30", have generally equal radii of curvature substantially corresponding to the curvature of the grooves 76, 77, 78 formed in the substrate 74. Using a clamping or weighting mode of pressing the wedges 62–64 into the grooves in the substrate 74 the curved diode bars 30–30''' are pressed into place within the grooves in a uniform, parallel curvilinear array.

FIGS. 12–15 illustrate another version of the stacked array embodiment of the invention which allows for parallel lead powering of individual diodes. This version is similar to the configurations of FIGS. 6A–9, in that it utilizes wedges to orient and secure the diode bars mutually parallel and perpendicular to the base, e.g. a beryllium oxide substrate. However, instead of connecting the diodes bars in series, the diode bars are connected in parallel by means of a wedge frame and multiple conductor bar.

Figure 12:
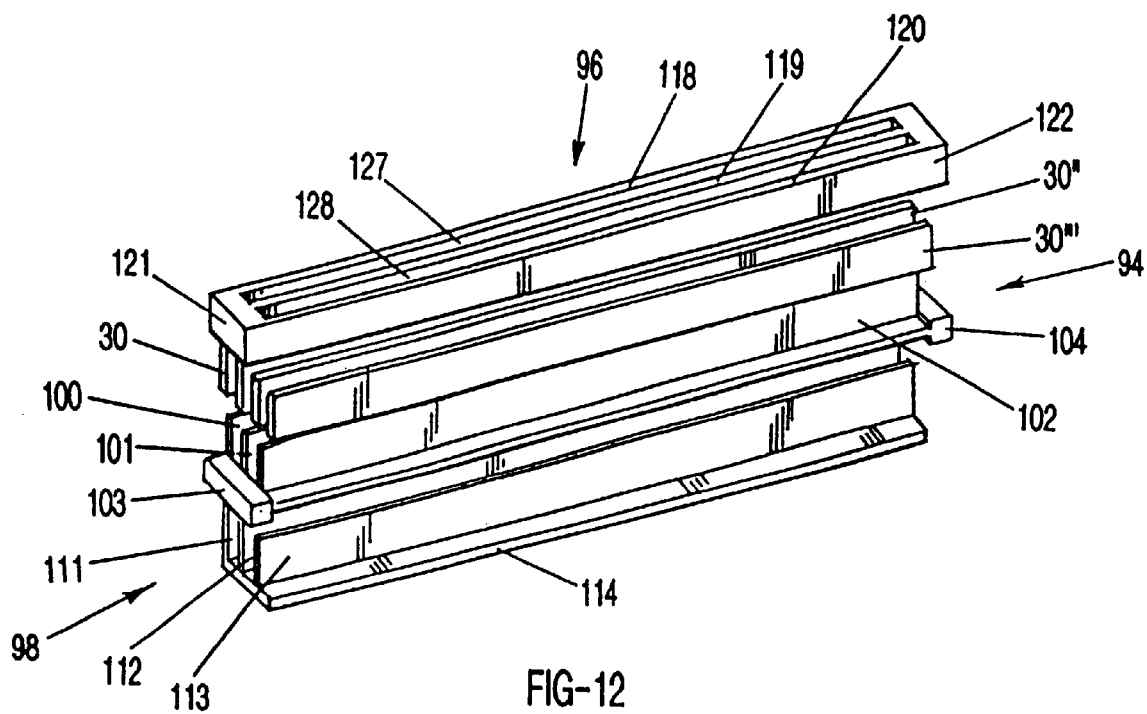
FIG. 12 is a perspective exploded view of still another alternative embodiment of the assembly according to the invention, illustrating an embodiment providing for parallel diode bar circuitry.
Figure 13:
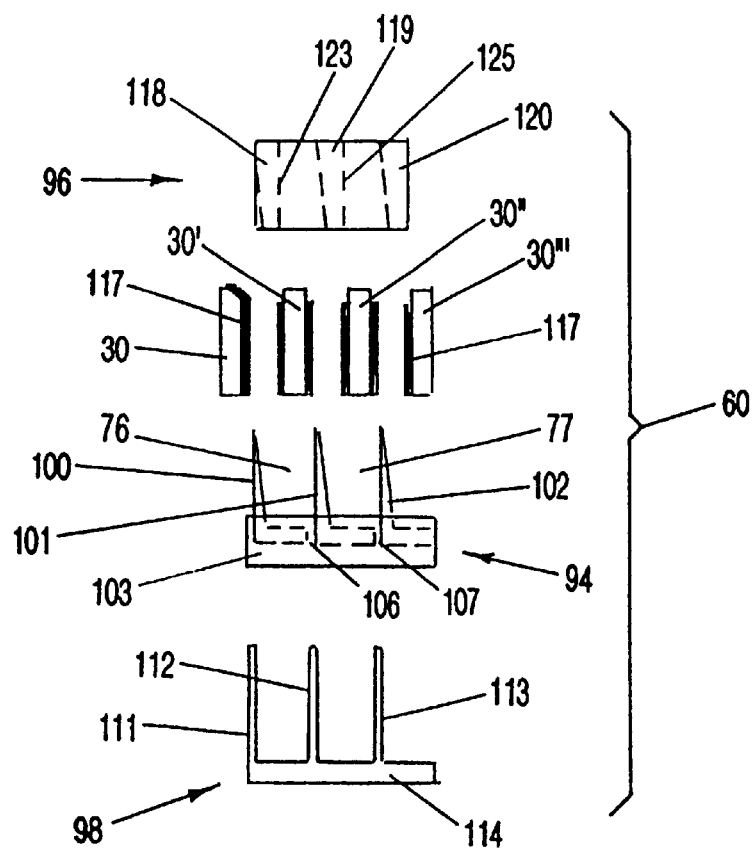
FIG. 13 is an exploded end view of the assembly shown in FIG. 12.

FIGS. 12 and 13 show the individual components, which include a base substrate 94, a wedge frame 96, a plurality of diode bars 30, 30', 30", 30''', and a conductor bar 98. The respective functions of these elements is substantially the same as the like elements previously described, except for the added provision of the conductor bar 98 (made for example, from copper) to provide for parallel circuitry.

FIGS. 12 and 13 illustrate that the conductor bar 98 comprises a plurality (corresponding to the number of diode bars desired to be mounted in the assembly) of longitudinally disposed, mutually parallel, generally fin-like conductive members 111, 112, 113 extending approximately perpendicularly from a planar base or bridge member 114. Electrical current may flow from one conductive member 111, to the next adjacent member 112 by means of the bridge member 114. The overall electrical conductivity of the conductor bar 98 provides the parallel electrical contact between one diode bar 30 in one groove 76 and a second diode bar 30' in an adjacent second groove 77 (FIG. 13).

Reference is made to FIGS. 12 and 13. The base substrate 94 is similar in material, form and function to the substrates of previous described embodiments, except that the substrate does not have a solid bottom. Instead, the upstanding, tapered, chocks 100, 101, 102 are interconnected only by end trusses 103, 104 fixed across the ends of the chocks. Thus, the chocks 100, 101, 102 are held together in spaced-apart relation by the end trusses 103, 104, thereby defining narrow longitudinal slits or apertures 106, 107 between respective adjacent chocks (FIG. 13). The apertures 106, 107 are sized and disposed to receive there through corresponding ones of the conductive members 112, 113, so that the conductive members 111, 112, 113 maybe placed in contact with the parallel vertical faces of the chocks 100, 101, 102 when the substrate 94 is lowered down onto the conductor bar 98.

The diode bars 30, 30', 30", 30''' are substantially similar to the diode bars previously described for other embodiments of the invention. The diode bars 30, 30' 30", 30''' are provided on their longer vertical faces with a conductive coating, strip, or solder, for example conductive solder 117 on the inside face of diode bar 30 in FIG. 13.

The wedge frame 96 is best shown in FIGS. 12 and 13. The wedge frame 96 is best characterized as including a plurality of wedge sections 118, 119, 120 extending between two end frame members 121, 122. The wedge sections 118, 119, 120 correspond generally in form and function with the wedges 62, 63, and 64 of previously described versions of the wedged array embodiment, except that the wedge sections optionally may be comparatively much longer axially than an individual wedge 62. Wedge sections have inclined surfaces 123,124 generally functioning the same as the inclined first face 91 on the individual wedges 62 of other versions (FIG. 6A). The end frame members 121, 122 hold the wedge sections 118, 119, 120 together but in spaced-apart parallel relation, so that there are longitudinal slits 127, 128 into which the diodes 30', 30" and chocks 101,102 can be firmly inserted, as indicated by FIG. 15.

The assembly of the wedged, parallel connected array 60 is evident from the foregoing, but one mode thereof nevertheless is briefly explained here. The base substrate 94 is securely but removably positioned in a suitable mounting tool or fixture (not shown). The conductor bar 98 is inserted upward through the base substrate 94, with the conductive members 112, 113 disposed through the apertures 106, 107 in the substrate; the protruding conductive strips 111, 112, 113 are immediately adjacent to corresponding faces of the chocks 100,101, 102 running the length of the substrate 94. A strip of solder is formed into a suitable shape and laid in between each diode bar 30–30''' and the conductive members 111,112, 113, and the diodes inserted into the grooves between the conductive members and the chocks 100–102. Another solder or other conductive strip can be provided on the other, exposed side of each diode bar, if required. The conductive wedge frame 96 is then placed upon the diode bars 30–30''' with the wedge sections 118–120 aligned between the diode bars and the inclined faces of the chocks 100–102. The wedge frame 96 is then pressed downward with sufficient uniform pressure to slide the wedge sections down along the inclined surfaces of the chocks, thereby forcing the diodes firmly against the conductive members 112, 113. As a result of this uniform, wedge-driven action, the diodes are optimally aligned, both as mutually parallel, as well as perpendicular to the end trusses 103, 104 and the conductive bridge 114 generally defining the bottom of the assembly 60.

By this means, the invention provides parallel electrical contact between a diode bar 30' in a first groove 76 and a second diode bar 30" in an adjacent second groove 77, where the substrate 94 defines the plurality of apertures 106, 107 there through, and the parallel contact means includes the conductor bar 98, which has at least one first conductive member 112 insertable through the aperture 106 in the substrate for electrical contact with the wedge section 118 in the first groove 76; the second conductive member 113 is insertable through another aperture 107 in the substrate for electrical contact with the second diode 30" in the second groove 77. The conductive bridge member 114 connects the two conductive members 112, 113 to complete a parallel circuit.

Figure 14:
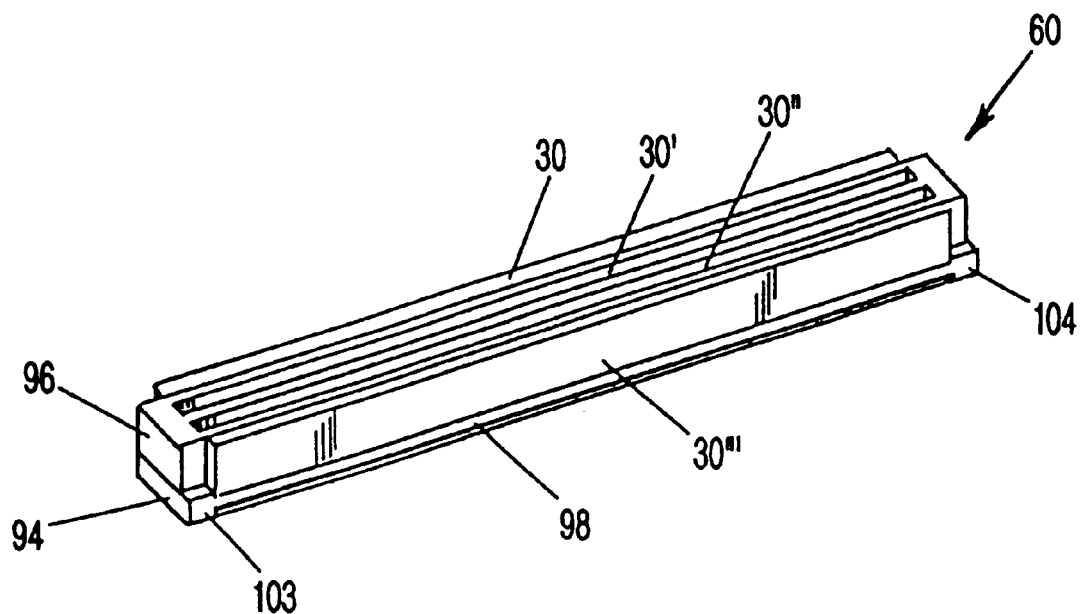
FIG. 14 is a perspective view of the embodiment illustrated in FIG. 12, showing the assembly in a fully assembled condition.
Figure 15:
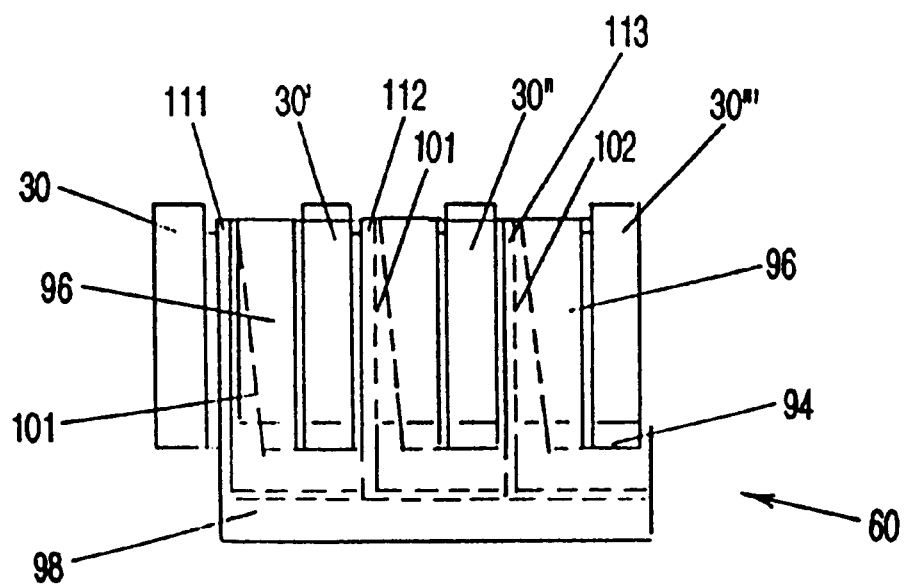
FIG. 15 is an end view of the assembly shown in FIG. 14.

FIGS. 14 and 15 show the assembly 60 with the wedge sections 118–120 fully inserted to press the diode bars 30–30''' into proper position. The assembly 60 may then be placed into the controlled heat source to melt the solder and bond the entire assembly, as previously explained.

In the forgoing disclosure, the wedges 62–64 and wedge sections 118–120 are described as being inserted downward in the vertical direction. It is evident to one of skill in the art that the wedges can be manufactured to allow for horizontal insertion instead. Also, all conductive strips alternatively may be provided by masking off the appropriate portions of the substrate 24 or 94, and electrically conductive material sputtered or otherwise coated on the selected appropriate key surfaces.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above, and of the corresponding provisional application, are hereby incorporated by reference.

What is claimed is:

1. A method for assembling a diode bar assembly, comprising tie steps of:
   (a) locating a first conductive spacer upon a planar working surface;
   (b) disposing a first solder preform, having a melting temperature, upon the first conductive spacer;
   (c) placing a diode bar upon the first solder preform;

(d) disposing a second solder preform having a melting temperature upon the diode bar;

(e) placing a second conductive spacer upon the second solder preform;

(f) compressing the spacers, preforms and diode bar parallel together;

(g) heating the solder preforms above their melting temperatures; and (h) allowing the melted solder preforms to harden by cooling, thereby bonding the spacers to the diode bar, and wherein the spacers bonded to the diode bar define a diode submodule.

2. The method of claim 1 wherein the step of compressing comprises disposing a weight upon the second spacer.

3. The method of claim 1 wherein the step of heating comprises placing the diode submodule in a controlled heat source while compressing the spacers, solder preforms, and diode bar.

4. The method of claim 1 further comprising the steps of; preparing a plurality of diode submodules according to steps (a)–(h) in claim 1; and affixing the plurality of diode submodules upon a substrate, the substrate being provided with a plurality of conductive strips, wherein after the step of affixing the plurality of diode submodules upon the substrate, the conductive strips are in electrical contact with respective solder preforms; and wherein the plurality of diode submodules affixed to the substrate define a diode bar array.

5. The method of claim 4 wherein the plurality of conductive strips comprise solder having a melting temperature less than the melting temperatures of the solder preforms, and wherein the step of affixing the plurality of diode submodules comprises the steps of:

(a) heating the plurality of diode submodules, the conductive strips, and the substrate to a temperature between the melting temperature of the conductive strips and the lowest melting temperature of the solder preforms;

(b) allowing the melted conductive strips to harden by cooling, thereby bonding the diode submodules to the substrate.

6. The method of claim 4 wherein the plurality of conductive strips comprise solder pre-applied to the substrate, and wherein the step of affixing the plurality of diode submodules further comprises the step of applying epoxy glue between the diode submodules and the substrate.

7. A method for assembling a diode bar ray, comprising the steps of:

(a) locating a first conductive spacer upon a planar working surface;

(b) disposing a first solder preform, having a melting temperature, upon the first conductive spacer;

(c) placing a diode bar upon the first solder preform;

(d) disposing a second solder preform having a melting temperature upon the diode bar;

(e) placing a second conductive spacer upon the second solder preform;

(f) compressing the spacers, preforms and diode bar parallel together;

(g) heating the solder preforms above their melting temperatures;

(h) allowing the melted solder preforms to harden by cooling, thereby bonding the spacers to the diode bar, and wherein the spacers bonded to the diode bar define a diode submodule;

(i) repeating steps (a)–(e) to prepare a plurality of diode submodules; and (j) affixing the plurality of diode submodules upon a substrate, the substrate being provided with a plurality of conductive strips, wherein after the step of affixing the plurality of diode submodules, the conductive strips are in electrical contact with respective solder preforms; and wherein the plurality of diode submodules affixed to the substrate define a diode bar array.

8. The method of claim 7 wherein the step of compressing comprises disposing a weight upon the second spacer.

9. The method of claim 8 wherein the step of heating comprises placing the diode submodule in a controlled heat source while compressing the spacers, solder preforms, and diode bar.

10. The method of claim 9 wherein the plurality of conductive strips comprise solder having a melting temperature less than the melting temperatures of the solder preforms, and wherein the step of affixing comprises the steps of:

(a) heating the plurality of diode submodules, the conductive strips, and the substrate to a temperature between the melting temperature of the conductive strips and the lowest melting temperature of the solder preforms;

(b) allowing the nelted conductive strips to harden by cooling, thereby bonding the diode submodules to the substrate.

11. The method of claim 9 wherein the plurality of conductive strips comprise solder pre-applied to the substrate, and wherein the step of affixing further comprises the step of applying epoxy glue between the diode submodules and the substrate.

\* \* \* \* \*